United States Patent
Kim et al.

(10) Patent No.: US 9,741,931 B1
(45) Date of Patent: Aug. 22, 2017

(54) SEMICONDUCTOR INTEGRATED CIRCUIT DEVICE INCLUDING SWITCHING ELEMENTS AND METHOD OF MANUFACTURING THE SAME

(71) Applicant: SK hynix Inc., Icheon-si, Gyeonggi-do (KR)

(72) Inventors: Hong Jung Kim, Icheon-si (KR); Young Hee Yoon, Icheon-si (KR); Jeong Ho Yi, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/404,940

(22) Filed: Jan. 12, 2017

(30) Foreign Application Priority Data

Aug. 2, 2016 (KR) .......................... 10-2016-0098541

(51) Int. Cl.
*H01L 27/24* (2006.01)
*H01L 45/00* (2006.01)

(52) U.S. Cl.
CPC ........ *H01L 45/141* (2013.01); *H01L 27/2481* (2013.01); *H01L 45/06* (2013.01); *H01L 45/1233* (2013.01); *H01L 45/1683* (2013.01); *H01L 27/24* (2013.01); *H01L 45/122* (2013.01); *H01L 45/1206* (2013.01)

(58) Field of Classification Search
CPC .... H01L 27/24; H01L 45/122; H01L 45/1206
USPC ............................................. 257/2; 438/382
See application file for complete search history.

(56) References Cited

U.S. PATENT DOCUMENTS

| | | | |
|---|---|---|---|
| 2003/0198096 A1* | 10/2003 | Kunikiyo | H03H 11/1291 365/200 |
| 2011/0140068 A1* | 6/2011 | Ozawa | H01L 27/249 257/4 |
| 2016/0035418 A1 | 2/2016 | Castro et al. | |
| 2017/0117325 A1* | 4/2017 | Kim | H01L 27/2409 |

* cited by examiner

*Primary Examiner* — George Fourson, III
(74) *Attorney, Agent, or Firm* — William Park & Associates Ltd.

(57) ABSTRACT

A semiconductor integrated circuit device may include a first signal line, a second signal line, a variable resistance material layer, and a third signal line. The second signal line may be positioned coplanar with the first signal line. The second signal line may be parallel to the first signal line. The variable resistance material layer may include a horizontal region arranged on the first and second signal lines, and may include a vertical region extending upwardly from an end of the horizontal region. The third signal line may be positioned on a plane different from a plane on which the first and second signal lines may be positioned. The third signal line may be arranged on an end of the vertical region of the variable resistance material layer.

16 Claims, 4 Drawing Sheets

SEMICONDUCTOR INTEGRATED CIRCUIT DEVICE INCLUDING SWITCHING ELEMENTS AND METHOD OF MANUFACTURING THE SAME

CROSS-REFERENCES TO RELATED APPLICATION

This application claims priority under 35 USC §119 to Korean Patent Application number 10-2016-0098541 filed on Aug. 2, 2016 in the Korean Intellectual Property Office (KIPO), the contents of which are herein incorporated by reference in their entirety.

BACKGROUND

1. Technical Field

Example embodiments relate to a semiconductor integrated circuit device and a method of manufacturing the same. More particularly, example embodiments relate to a semiconductor integrated circuit device including a switching element and a method of manufacturing the semiconductor integrated circuit device.

2. Related Art

In a semiconductor integrated circuit device, various switching elements are used to connect or disconnect signals and communication paths between two elements. For example, the switching elements may be used for accessing memory cells of the semiconductor integrated circuit device. Examples of the switching elements may include a MOS transistor and a diode.

The growth in demand for highly integrated semiconductor devices is driving the need for highly integrated switching elements. Thus, a three-dimensional switching element is being developed.

SUMMARY

According to example embodiments, a semiconductor integrated circuit device may include a first signal line, a second signal line, a variable resistance material layer, and a third signal line. The second signal line may be positioned coplanar with the first signal line. The second signal line may be parallel to the first signal line. The variable resistance material layer may include a horizontal region arranged on the first and second signal lines, and may include a vertical region extending upwardly from an end of the horizontal region. The third signal line may be positioned on a plane different from a plane on which the first and second signal lines may be positioned. The third signal line may be arranged on an end of the vertical region of the variable resistance material layer.

According to example embodiments, a method of manufacturing a semiconductor integrated circuit device may include forming a conductive layer on a semiconductor substrate. The method may include patterning the conductive layer to form a first signal line and a second signal line. The method may include forming a horizontal region of a variable resistance material layer being in electrical contact with the first and second signal lines. The method may include forming a vertical region of the variable resistance material layer extending upwardly the horizontal region of the variable resistance material layer. The vertical region may be connected to an end of the horizontal region. The method may also include forming a third signal line on the vertical region.

According to example embodiments, a semiconductor integrated circuit device may include an input line, an output line, a first variable resistance material layer, a second variable resistance material layer, a ground voltage line, and a power voltage line. The input line may carry an input signal. The output line may be parallel to the input line to carry an output signal. The first variable resistance material layer may include a horizontal region being in electrical contact with the input line and the output line, and may include a vertical region extending upwardly from the horizontal region. The horizontal region and the vertical region of the first variable resistance material layer may include N type impurities. The second variable resistance material layer may be parallel to the first variable resistance material layer. The second variable resistance material layer may include a horizontal region being in electrical contact with the input line and the output line, and may include a vertical region extending upwardly from the horizontal region of the second variable resistance material layer. The horizontal region and the vertical region of the second variable resistance material layer may include P type impurities. The ground voltage line may be coupled to the vertical region of the first variable resistance material layer. The power voltage line may be coupled to the vertical region of the second variable resistance material layer

BRIEF DESCRIPTION OF THE DRAWINGS

Example embodiments will be more clearly understood from the following detailed description taken in conjunction with the accompanying drawings.

FIG. 1 is a diagram illustrating an NMOS transistor which may be used as a switching element.

FIG. 2 is a cross-sectional view illustrating an example of a switching device having three terminals.

FIG. 3 is a perspective view illustrating an example of a switching device having three terminals in accordance with example embodiments.

FIG. 4 is a cross-sectional view illustrating an example of a switching device having three terminals in accordance with example embodiments.

FIG. 5 is a diagram illustrating an example of an inverter including a switching device having three terminals in accordance with example embodiments.

FIG. 6 is a perspective view illustrating an example of an inverter embodied using a switching device having three terminals in accordance with example embodiments.

DETAILED DESCRIPTION

Figure 1:
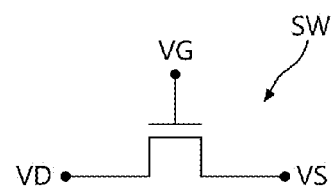
FIGS. 1 to 6 represent non-limiting, example embodiments as described herein.

Various example embodiments will be described more fully hereinafter with reference to the accompanying drawings, in which some example embodiments are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

FIG. 1 is a diagram illustrating an NMOS transistor that may be used as a switching element.

Referring to FIG. 1, the NMOS transistor may include a gate, a source, and a drain. The source and the drain may be electrically connected to each other in response to a gate voltage VG applied to the gate. A source voltage VS may be applied to the source. A drain voltage VD may be applied to the drain.

In general, the NMOS transistor may include source/drain regions, which are formed in a semiconductor substrate, and a gate formed on the semiconductor substrate between the source and the drain.

To highly integrate a semiconductor device, a switching element in the semiconductor device may have a three-dimensional structure that includes a channel disposed between the source and the drain. Here, a variable resistance material may be used in the switching element. For example, an Ovonics threshold switch (OTS) device (e.g., OTS device using a chalcogenide layer) may be used as a switching element.

Figure 2:
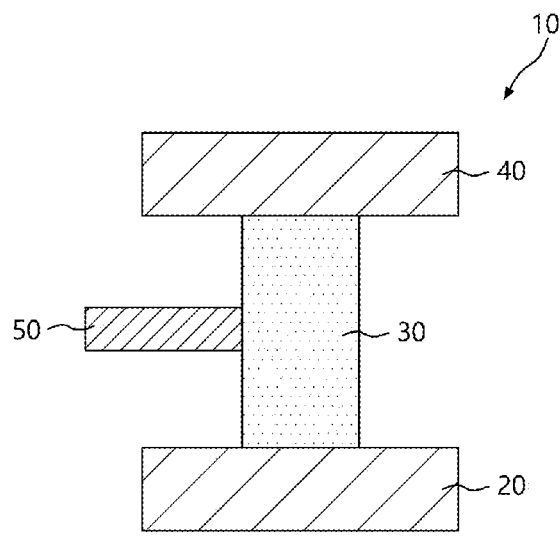

FIG. 2 is a cross-sectional view illustrating an example of a switching device having three terminals.

Referring to FIG. 2, the switching device 10 may include a lower electrode 20, a variable resistance material layer 30, and an upper electrode 40. Here, examples of the variable resistance material layer 30 may include a phase change material layer such as a chalcogenide layer. In an embodiment, the switching device 10 may be a three-terminal OTS device. The variable resistance material layer 30 may be formed on the lower electrode 20. The upper electrode 40 may be formed on the variable resistance material layer 30. The switching device 10 may use characteristics of the variable resistance material layer 30 such as chalcogenide layer to switch it into an "on" state or into an "off" state. When a voltage greater than or equal to a threshold switching voltage (or when a current greater than or equal to a threshold switching current) of the variable resistance material layer 30 is applied to the variable resistance material layer 30 from the upper electrode 40 or from the lower electrode 20, the variable resistance material layer 30 (e.g., chalcogenide layer) may switch itself from a high-resistance state (e.g., amorphous state or insulating state) to a low-resistance state (e.g., crystalline state or conductive state). That is, the switching device 10 may perform a switching operation by creating a voltage difference between the upper electrode 40 and the lower electrode 20.

The variable resistance material layer 30 may include one chalcogen element and at least one chemical or structural modifying element. For example, examples of the chalcogen element may include Tellurium (Te), Selenium (Se), and Sulfur (S). Examples of the modifying element may include elements such as Gallium (Ga), Aluminium (Al), and Indium (In). Examples of the modifying element may also include Phosphorus (P), Arsenic (As) and Antimony (Sb). The resistance of the variable resistance material layer 30 may vary depending on composition ratios of the elements and a thickness of the variable resistance material layer 30.

The switching device 10 may use the upper electrode 40 and the lower electrode 20 as voltage terminals. In order to use the switching device 10 as the three-dimensional switching element in place of a MOS transistor, an additional interconnect terminal for controlling the switching device 10 may be required.

In an example, the additional interconnect terminal may be arranged between the upper electrode 40 and the lower electrode 20. The additional interconnect terminal may electrically contact with the variable resistance material layer 30. That is, in an example, the three terminals type switching device requires a control electrode 50 in addition to the upper electrode 40 and the lower electrode 20, as illustrated in FIG. 2. However, it may be difficult to form the control electrode 50 because it requires an additional process for forming a metal interconnect between processes for forming the lower electrode 20 and the upper electrode 40.

Figure 3:
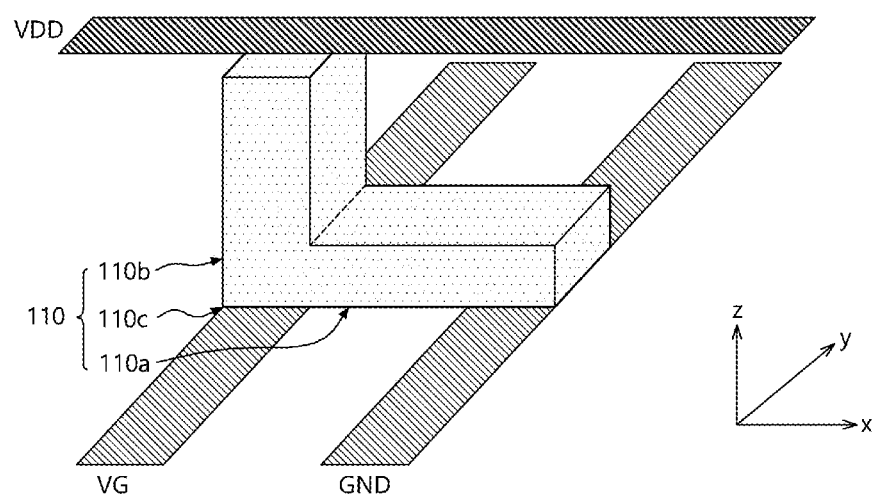

FIG. 3 is a perspective view illustrating an example of a switching device having three terminals in accordance with example embodiments.

Referring to FIG. 3, a three-terminal switching device 100 may be embodied using a bent variable resistance material layer 110. This structure may be formed without forming an additional interconnect terminal. The three-terminal switching device 100 may include the variable resistance material layer 110 having a horizontal region 110a and a vertical region 110b. The horizontal region 110a may extend in an x-direction. The vertical region 110b may extend in a z-direction. Thus, the horizontal region 110a may be substantially perpendicular to the vertical region 110b. A bent portion 110c may be formed at an intersection between the horizontal region 110a and the vertical region 110b.

A gate voltage line VG may extend from a first end of the horizontal region 110a. A ground voltage line GND may extend from a second end of the horizontal region 110a opposite to the first end. For example, the gate voltage line VG and the ground voltage line GND may extend in parallel to each other along a y-direction. The gate voltage line VG and the ground voltage line GND may be coplanar with each other. For example, the gate voltage line VG and the ground voltage line GND may be positioned on a bottom surface of the horizontal region 110a.

A power voltage line VDD may be connected to an upper surface of the vertical region 110b. The power voltage line VDD may extend in the x-direction.

A voltage difference between a power voltage and a gate voltage may be set to a threshold switching voltage Vth or a higher voltage to change the variable resistance material layer 110 to a different resistance state (e.g., from a high-resistance state to a low-resistance state). A voltage difference between the gate voltage and a ground voltage may be set to a threshold switching voltage Vth or a higher voltage.

When the gate voltage is applied, the vertical region 110b of the variable resistance material layer 110 may become a different resistance state (e.g., a low-resistance state) by the voltage difference between the gate voltage and the power voltage. The horizontal region 110a of the variable resistance material layer 110 may become a different resistance state (e.g., a low-resistance state) by the voltage difference between the gate voltage and the ground voltage. Thus, a current path, i.e., a channel may be formed between an end of the vertical region 110b corresponding to a drain and the second end of the horizontal region 110a corresponding to a source. In an embodiment, the power voltage line VDD, the gate voltage line VG, the ground voltage line GND, and the variable resistance material layer 110 may act as a switch by setting a voltage difference between the power voltage line and the gate voltage line and a voltage difference between the gate voltage line and the ground voltage line to a threshold switching voltage or a higher voltage to change a resistance of the variable resistance material layer 110. For example, in a case where the variable resistance material layer is a chalcogenide layer, the power voltage line, the gate voltage line, the ground voltage line, and the chalcogenide layer may act as a switch by setting a voltage difference between the power voltage line and the gate voltage line and a voltage difference between the gate voltage line and the ground voltage line to a threshold switching voltage or a higher voltage to change a phase of the chalcogenide layer.

Figure 4:
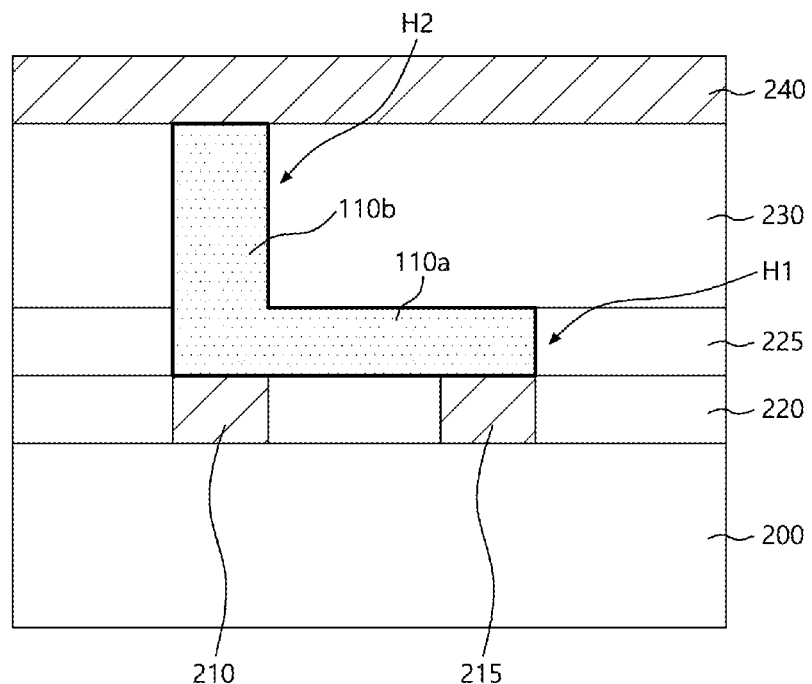

FIG. 4 is a cross-sectional view illustrating an example of a switching device having three terminals in accordance with example embodiments.

Referring to FIG. 4, a first conductive line 210 and a second conductive line 215 may be formed on a semiconductor substrate 200 having electrical circuits and insulating layers therein (not illustrated). The first conductive line 210 may correspond to the gate voltage line VG. The second conductive line 215 may correspond to the ground voltage line GND. The first and second conductive lines 210 and 215 may extend in parallel, and may be spaced apart from each other at a uniform gap. The first and second conductive lines 210 and 215 may include the same or substantially the same material as each other. A first insulating interlayer 220 may be formed between the first and second conductive lines 210 and 215.

A second insulating interlayer 225 may be formed on the first insulating interlayer 220. The second insulating interlayer 225 may be etched to form a first hole H1, which exposes the first and second conductive lines 210 and 215. A chalcogenide material may be formed in the first hole H1 to form the horizontal region 110a. The horizontal region 110a may be in electrical contact with the first and second conductive lines 210 and 215. For example, the horizontal region 110a may be in direct physical contact with the first and second conductive lines 210 and 215.

A third insulating interlayer 230 may be formed on the horizontal region 110a and the second insulating interlayer 225. The third insulating interlayer 230 may have a thickness greater than that of the second insulating interlayer 225. The third insulating interlayer 230 may be etched to form a second hole H2, which exposes the first end of the horizontal region 110a. The second hole H2 may have a diameter shorter than that of the first hole H1. A chalcogenide material may be formed in the second hole H2 to form the vertical region 110b. A third conductive line 240 may be formed on the third insulating interlayer 230 and the vertical region 110b. The third conductive line 240 may correspond to the power voltage line VDD.

Figure 5:
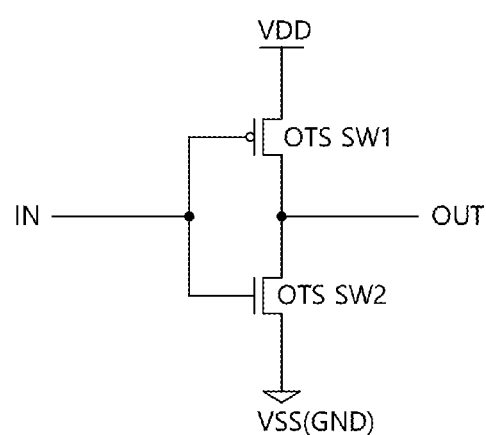

FIG. 5 is a diagram illustrating an example of an inverter including a switching device having three terminals in accordance with example embodiments.

Referring to FIG. 5, an inverter circuit may include a PMOS transistor and an NMOS transistor. The inverter circuit may use a P-type-three-terminal switching device OTS SW1 in place of the PMOS transistor and an N-type-three-terminal switching device OTS SW2.

Figure 6:
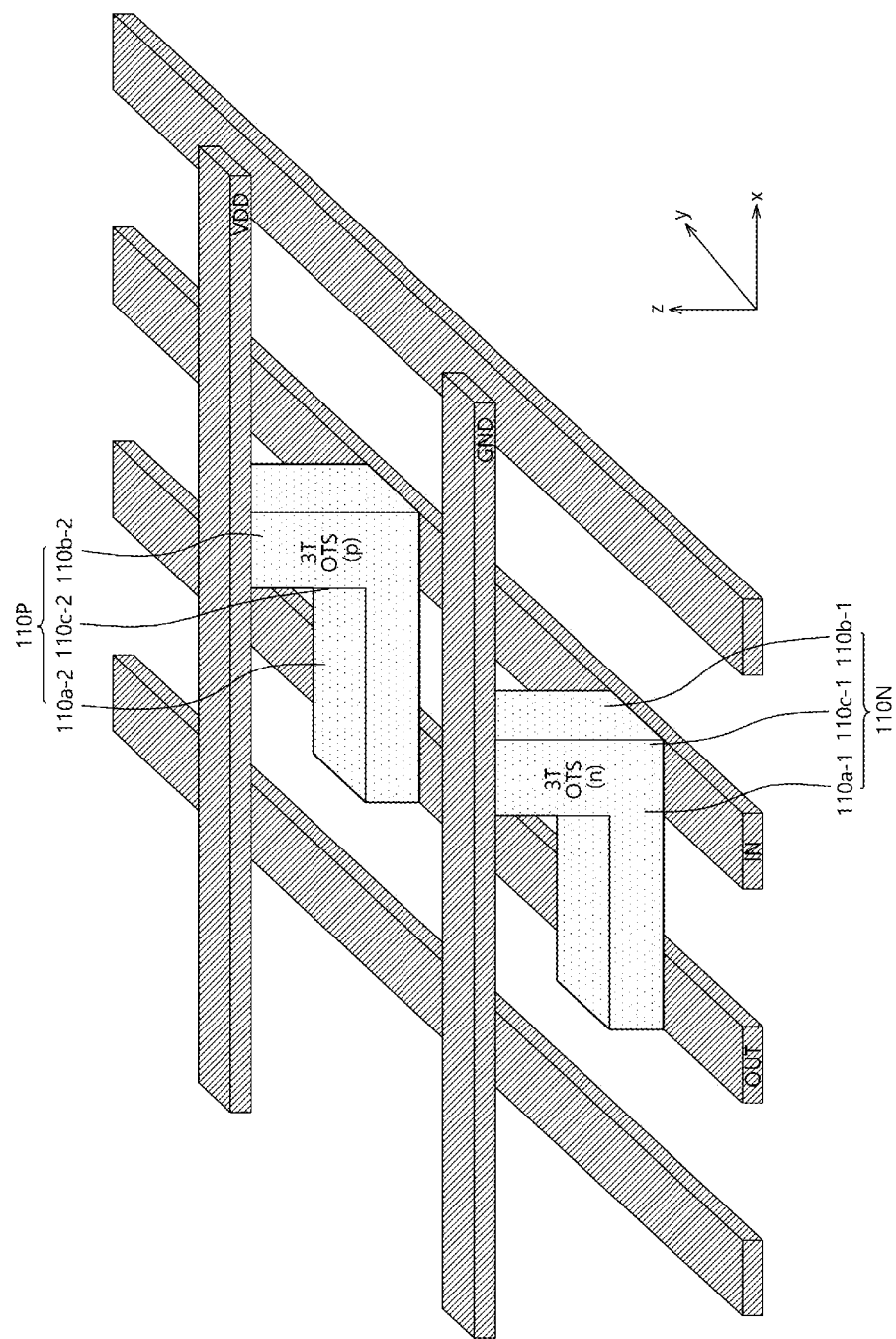

FIG. 6 is a perspective view illustrating an example of an inverter embodied using a switching device having three terminals in accordance with example embodiments.

Referring to FIG. 6, an input line IN and an output line OUT may extend in parallel to each other along the y-direction. A first horizontal region 110a-1 and a second horizontal region 110a-2 may be formed on the input line IN and the output line OUT. The first horizontal region 110a-1 and the second horizontal region 110a-2 may be in electrical contact with the input line IN and the output line OUT. For example, the first horizontal region 110a-1 and the second horizontal region 110a-2 may be in direct physical contact with the input line IN and the output line OUT. The first horizontal region 110a-1 may correspond to a variable resistance material layer doped with N type impurities. The second horizontal region 110a-2 may include a variable resistance material layer doped with P type impurities. For example, the variable resistance material layers may be a chalcogenide layers. The first and second horizontal regions 110a-1 and 110a-2 may be spaced apart from each other. The first and second horizontal regions 110a-1 and 110a-2 may extend in the z-direction.

A first vertical region 110b-1 may be formed on an edge portion of the first horizontal region 110a-1. A second vertical region 110b-2 may be formed on an edge portion of the second horizontal region 110a-2. For example, the first vertical region 110b-1 may extend along the z-direction from the first horizontal region 110a-1 corresponding to the input line IN. The second vertical region 110b-2 may extend along the z-direction from the second horizontal region 110a-2, which is in electrical contact with the input line IN. The first vertical region 110b-1 may correspond to a variable resistance material layer doped with N type impurities. The second vertical region 110b-2 may correspond to a variable resistance material layer doped with P type impurities. For example, the variable resistance material layers may be a chalcogenide layers. In this way, first and second variable resistance material layers 110N and 110P including the horizontal regions 110a-1 and 110a-2 and the vertical regions 110b-1 and 110b-2 may be defined. A reference numeral 110c-1 may indicate a bent portion of the first variable resistance material layer 110N. A reference numeral 110c-2 may indicate a bent portion of the second variable resistance material layer 110P.

The ground voltage line GND may be formed over the first vertical region 110b-1 of the first variable resistance material layer 110N. For example, the ground voltage line GND may be coupled to a top end of the first vertical region 110b-1 of the first variable resistance material layer 110N. The power voltage line VDD may be formed over the second vertical region 110b-2 of the second variable resistance material layer 110P. For example, the power voltage line VDD may be coupled to a top end of the second vertical region 110b-2 of the second variable resistance material layer 110P.

Therefore, when an input signal may be applied through the input line IN, the first and second variable resistance material layers 110N and 110P may be selectively operated by voltage differences between the power voltage and the input signal, between the input signal and the output line, and between the input signal and the ground voltage to perform inverting operations.

According to example embodiments, the variable resistance material layer may include the L-shaped bent portion. Thus, the three-terminal switching device may be embodied without a control electrode.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor integrated circuit device comprising:
   a first signal line;
   a second signal line positioned coplanar with the first signal line, the second signal line being parallel to the first signal line;
   a variable resistance material layer including a horizontal region and a vertical region, the horizontal region being disposed on the first and second signal lines, the vertical region extending upwardly from an end of the horizontal region; and
   a third signal line positioned on a plane different from a plane on which the first and second signal lines are positioned, the third signal line being arranged on an end of the vertical region of the variable resistance material layer.

2. The semiconductor integrated circuit device of claim 1, wherein the first signal line becomes electrically connected to the third signal line by changing a resistance of the vertical region and the horizontal region of the variable resistance material layer to a low resistance in response to a voltage applied to the second signal line.

3. The semiconductor integrated circuit device of claim 1, wherein different voltages are applied to the first signal line, the second signal line and the third signal line, and a voltage difference between the first signal line and the second signal line and a voltage difference between the second signal line and the third signal line are set to a threshold switching voltage or a higher voltage to change the variable resistance material layer to a different resistance state.

4. The semiconductor integrated circuit device of claim 3, wherein a ground voltage is applied to the first signal line, a power voltage is applied to the third signal line, and a control voltage corresponding to a voltage between the ground voltage and the power voltage is applied to the second signal line.

5. The semiconductor integrated circuit device of claim 1, wherein the third signal line is intersected with the first and second signal lines.

6. The semiconductor integrated circuit device of claim 1, wherein the variable resistance material layer is a chalcogenide layer.

7. The semiconductor integrated circuit device of claim 6, wherein the first through third signal lines and the chalcogenide layer act as a switch by setting a voltage difference between the first signal line and the second signal line and a voltage difference between the second signal line and the third signal line to a threshold switching voltage or a higher voltage to change a phase of the chalcogenide layer.

8. A method of manufacturing a semiconductor integrated circuit device, the method comprising:
   forming a conductive layer on a semiconductor substrate;
   patterning the conductive layer to form a first signal line and a second signal line;
   forming a horizontal region of a variable resistance material layer being in electrical contact with the first and second signal lines;

forming a vertical region of the variable resistance material layer extending upwardly from the horizontal region; and forming a third signal line on the vertical region.

9. The method of claim 8, wherein forming the vertical region comprises:

forming a first insulating interlayer on the semiconductor substrate to fill a space between the first and second signal lines;

forming a second insulating interlayer on the first insulating interlayer;

etching the second insulating interlayer to form a first hole configured to expose the first and second signal lines; and filling the first hole with a chalcogenide material.

10. The method of claim 9, wherein forming the vertical region comprises:

forming a third insulating interlayer on the second insulating interlayer and the horizontal region;

etching the third insulating interlayer to form a second hole configured to expose an end of the horizontal region; and filling the second hole with the chalcogenide material.

11. The method of claim 10, wherein the third insulating interlayer has a thickness greater than a thickness of the second insulating interlayer.

12. The method of claim 10, wherein the third signal line is in electrical contact with the vertical region on the third insulating interlayer.

13. A semiconductor integrated circuit device comprising:

an input line configured to carry an input signal;

an output line extending in parallel to the input line to carry an output signal;

a first variable resistance material layer including a horizontal region and a vertical region, the horizontal region being in electrical contact with the input line and the output line, the vertical region extending upwardly from the horizontal region of the first variable resistance material layer, the horizontal region and the vertical region of the first variable resistance material layer including N type impurities;

a second variable resistance material layer extending in parallel to the first variable resistance material layer, the second variable resistance material layer including a horizontal region and a vertical region, the horizontal region being in electrical contact with the input line and the output line, the vertical region extending upwardly from the horizontal region of the second variable resistance material layer, the horizontal region and the vertical region of the second variable resistance material layer including P type impurities;

a ground voltage line coupled to the vertical region of the first variable resistance material layer; and a power voltage line coupled to the vertical region of the second variable resistance material layer.

14. The semiconductor integrated circuit device of claim 13, wherein, in response to the input signal, electrical resistances of the vertical and horizontal regions of the first variable resistance material layer decrease or electrical resistances of the vertical and horizontal regions of the second variable resistance material layer decrease.

15. The semiconductor integrated circuit device of claim 13, wherein the first and second variable resistance material layer are chalcogenide layers.

16. The semiconductor integrated circuit device of claim 15, wherein the input and output lines, the first and second chalcogenide layers, the ground voltage line, and the power voltage line act as switching elements by changing phases of the first and second chalcogenide layers.

* * * * *